(12) United States Patent
Premy

(10) Patent No.: US 6,807,498 B2
(45) Date of Patent: Oct. 19, 2004

(54) METHOD FOR MEASURING PLL LOCK TIME

(75) Inventor: Amit Kumar Premy, Guna (IN)

(73) Assignee: Texas Instruments Incorporated, Dallas, TX (US)

( * ) Notice: Subject to any disclaimer, the term of this patent is extended or adjusted under 35 U.S.C. 154(b) by 34 days.

(21) Appl. No.: 10/195,906

(22) Filed: Jul. 16, 2002

(65) Prior Publication Data

US 2003/0163267 A1 Aug. 28, 2003

Related U.S. Application Data

(60) Provisional application No. 60/358,869, filed on Feb. 22, 2002.

(51) Int. Cl.[7] .............................................. G06F 19/00
(52) U.S. Cl. ............................. 702/79; 331/44; 324/521
(58) Field of Search ............................... 702/79, 69, 76, 702/89, 107; 331/44; 324/521

(56) References Cited

U.S. PATENT DOCUMENTS

| | | | | | |
|---|---|---|---|---|---|
| 5,485,101 | A | * | 1/1996 | Hynes | .......................... 324/617 |
| 5,969,576 | A | * | 10/1999 | Trodden | ...................... 331/1 A |
| 6,016,080 | A | * | 1/2000 | Zuta et al. | ..................... 331/25 |
| 6,233,529 | B1 | * | 5/2001 | Nonaka | ........................ 702/76 |
| 6,396,889 | B1 | * | 5/2002 | Sunter et al. | ................ 375/376 |
| 2001/0006343 | A1 | * | 7/2001 | Yoshizawa | ................ 324/76.77 |
| 2001/0024142 | A1 | * | 9/2001 | Tan et al. | ...................... 331/25 |
| 2002/0191714 | A1 | * | 12/2002 | Primack et al. | ............. 375/327 |
| 2003/0098696 | A1 | * | 5/2003 | Li et al. | ....................... 324/615 |

OTHER PUBLICATIONS

Agilent Technologies Application Note, "Agilent AN 1275 Automatic Frequency Settling Time Measurement Speeds Time–to–Market for RF Designs",Copyright 2000.*

Rohde & Schwarz, "Measuring Frequency Settling Time for Synthesizers and Transmitters", unknown date.*

* cited by examiner

*Primary Examiner*—Patrick Assouad
(74) *Attorney, Agent, or Firm*—Frederick J. Telecky, Jr.; W. James Brady III

(57) ABSTRACT

A method of measuring the PLL lock time includes deriving the PLL frequency-settling function by demodulation and envelope extraction in the time domain. The PLL lock time can then be calculated from this function. Using this PLL lock time measurement method provides for very good frequency and time accuracy. Also, since for demodulation, the settled signal is used for multiplication, ATE synchronization is not required. Furthermore, since all the processing is done in the time domain, calculation times are reduced, making the process suitable for ATE environments.

14 Claims, 5 Drawing Sheets

METHOD FOR MEASURING PLL LOCK TIME

This application claims priority under 35 USC §119(e)(1) of provisional application Ser. No. 60/358,869, filed Feb. 22, 2002.

TECHNICAL FIELD

This invention relates in general to the field of electronics and more specifically to a method for measuring the lock time of a phase lock loop (PLL) circuit.

BACKGROUND

The lock time of a PLL circuit is typically measured using Automatic Test Equipment (ATE) that perform Fast Fourier Transforms (FFTs) on a small time window of a captured PLL output signal. The window is moved across the captured data waveform and the frequency is measured using the FFT. This prior art technique suffers from three main problems. First, the frequency resolution depends on the samples in the window. Therefore, in order to maintain good time resolution, the PLL output signal has to be captured at a very high speed to get enough samples in the small time window. Secondly, this method inherently suffers from spectral leakage in the FFT, which reduces the overall accuracy of the resulting measurement. And lastly, since FFTs have to be performed on a large number of windows, the overall test time is very long.

Given the problems mentioned above, some manufactures of radio frequency (RF) devices, such as synthesizers that use PLL circuits, do not measure PLL lock times for each RF device. Lock times for these integrated circuits (ICs) are typically characterized in the lab using test equipment such as Agilent's 4352B, VCO/PLL Signal Analyzer or a Hewlett-Packard HP53310A, Modulation Domain Analyzer, on a small sample of the manufactured ICs. However, given that the PLL lock time is a very critical parameter in applications such as cellular radios and other applications where PLL lock times are critical, it important that PLL lock times be tested in production, in order to assure ICs meet their PLL lock time specifications. Thus, it would be beneficial in the art if a method were available that would allow for the measuring of PLL lock times accurately and in a short amount of time.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
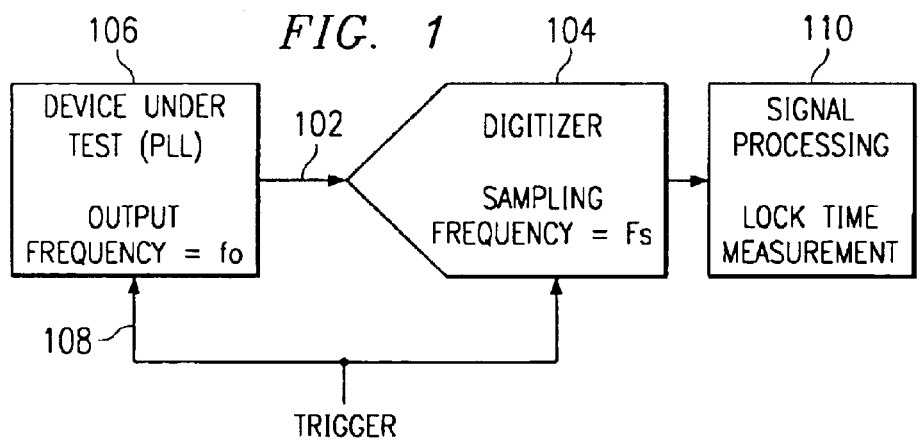
FIG. 1 shows a test setup for use in testing a PLL in accordance with the invention.

While the specification concludes with claims defining the features of the invention that are regarded as novel, it is believed that the invention will be better understood from a consideration of the following description in conjunction with the drawing figures, in which like reference numerals are carried forward.

The new method presented here allows measuring PLL lock time accurately and in a short amount of time. Frequency demodulation of the PLL output is done in the time domain to extract the frequency settling function. Lock time is then calculated from this function. This technique can be easily implemented on any mixed signal ATE, which allows time domain capture of the PLL signal with the ability to trigger a digitizer when the PLL is turned on.

The basic setup for the measurement of the PLL lock time using the method of the present invention is shown in FIG. 1. The output signal 102 of PLL (device currently being tested) 106 is connected to a digitizer 104. A trigger signal 108 turns the PLL 106 on and starts the digitizer 104 simultaneously. A signal processing block 110 performs the lock time measurement as well be explained below. PLL output 102 is captured for time period T, such that T is much greater than two times the expected lock time of the PLL (see FIG. 2). The captured waveform, y, can be represented by the following equation 1 after amplitude normalization:

$$y=\cos(2\pi f_0 t+g(t)+\phi) \text{ for, } 0<t<T \quad \text{(Equation 1)}$$

Where, $f_0$=locked frequency of the PLL, g(t)=phase modulation function (in radians), which becomes zero when the PLL is locked, and $\phi$=initial phase of the captured waveform.

Figure 2:
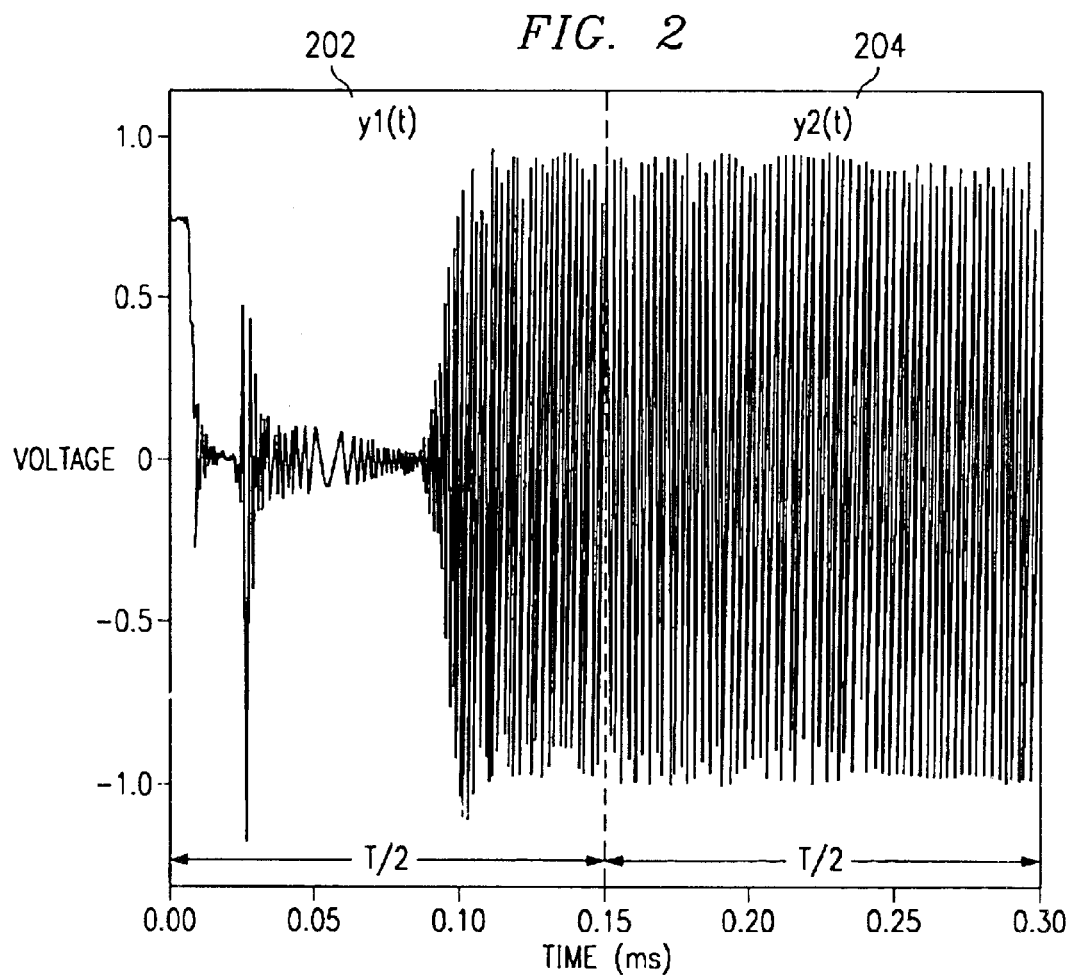
FIG. 2 shows a graph that shows a captured waveform with PLL settling.

In accordance with the preferred embodiment of the invention, the captured waveform is then divided into two waveforms, y1 202 and y2 204, of equal time interval T/2 as shown in FIG. 2. Then, waveforms y1 and y2 can be represented as:

$$y1(t)=\cos(2\pi f_0 t+g(t)+\phi_1), \text{ for } 0=<t<T/2; \quad \text{(i).}$$

$$y2(t)=\cos(2\pi f_0 t+\phi_2), \text{ for } T/2=<t<T, \quad \text{(ii).}$$

where, $\phi_1$=initial phase of waveform y1, $\phi_2$=initial phase of waveform y2; and next $$\text{waveform } y3(t)=2*y1*y2=\cos(4\pi f_0 t+g(t)+\phi_1+\phi_2)+\cos(g(t)+\phi_1-\phi_2), \quad \text{(iii).}$$

where y3 contains a high frequency component, $z1=\cos(4\pi f_0 t+g(t)+\phi_1+\phi_2)$ and a low frequency component $z2=[\cos(g(t)+\phi_1-\phi_2)]$.

Next, a time interval $\Delta T$ is considered, such that $T=N\Delta T$. $\Delta T$ is then chosen in such a way that $\Delta T$ contains multiple cycles of z1 and the value of z2 is relatively constant in this interval. For all such intervals of y3, the mean is taken and is represented by the waveform y4. This effectively filters out the high frequency component and gives the envelop of y3, represented by waveform y4, where:

$$y4(n\Delta T)=\cos(g(n\Delta T)+\phi_1-\phi_2) \text{ for } 0=<n<N, \quad \text{(iv)}.$$

$$y5(n\Delta T)=\cos^{-1}[y4(n\Delta T)]=g(n\Delta T)+\phi_1-\phi_2 \text{ for } 0=<n<N, \quad \text{(v)}.$$

where waveform y5 represents the phase modulation function, which is the integration of the frequency modulation term, and $$y6(n\Delta T)=(y5(n\Delta T)-y5((n-1)\Delta T))/\Delta T \text{ for } 1=<N, \quad \text{(vi)}.$$

where waveform y6 represents d/dt (g(t)), frequency modulation term (in radians/sec), we are interested in, and finally $$y7(n\Delta T)=y6(n\Delta T)/2 \text{ for } 1=<n<N, \quad \text{(vii)}.$$

where y7 gives the frequency variation with respect to $f_0$ (in Hz) versus time. From y7 the time after which the frequency variation relative to $f_0$ within the required limits can be calculated and this time is the PLL lock time.

Using the method described above for determining the PLL lock time allows for very good frequency and time accuracy to be achieved. Typical accuracy of available lab instruments is in the order of 1 KHz. Using this method, accuracy of 200 Hz and better can be achieved. The reason for the greater accuracy is because the envelope is extracted by taking the mean over a small interval of time. This removes the phase noise variation and gives very accurate frequency settling.

Since for demodulation, the settled signal is used for multiplication in the present invention. ATE synchronization is not required. Which implies that it is not necessary to provide a reference frequency from the tester and the on board crystal can provide the reference frequency. This allows measuring the affect of the crystal oscillator on the lock time. Since all the processing is done in the time domain, calculation time is reduced, which makes the method of the present invention very suitable for ATE implementation. Typical measurement time on ATE is around 300 ms and can be further optimized.

Another advantage of the present invention is that no special instrumentation is required to measure the PLL lock time. Only a digitizer is required to capture the PLL output. In case, the PLL frequency is very high, a down-converter (not shown) is required before digitization, which is typically available in all RF testers. So the test equipment requirements are kept to a minimum, thus further reducing the testing costs.

Figure 3:
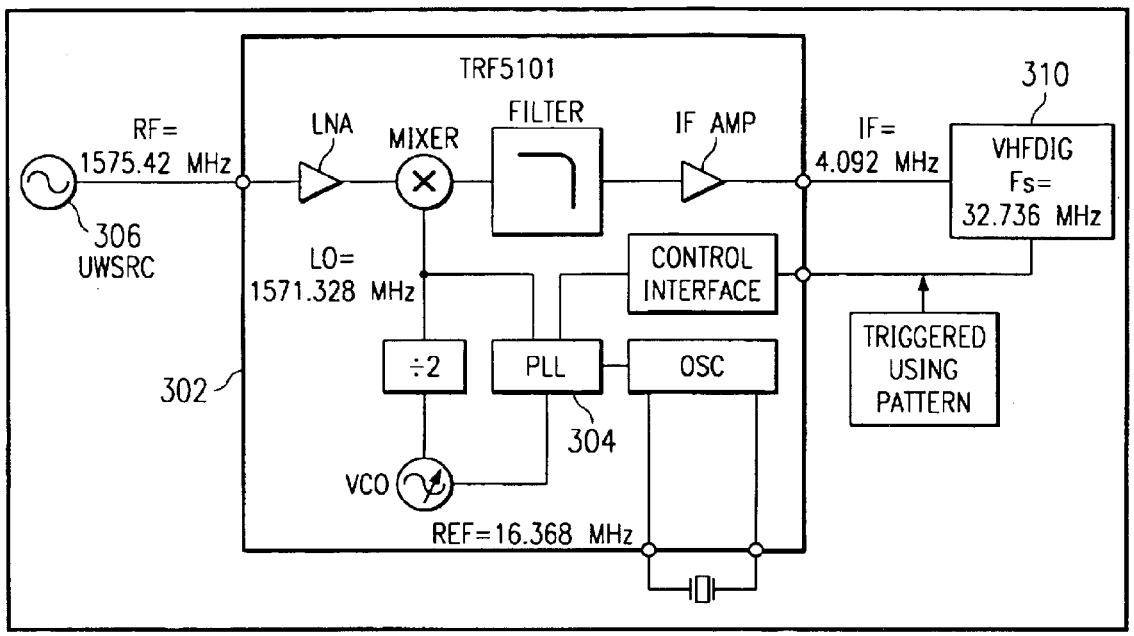
FIG. 3 shows a test setup for PLL lock time measurement in accordance with the invention.

In order to better understand the method of the present invention, an example of a measurement setup is shown in FIG. 3. FIG. 3 shows a Global Positioning System (GPS) receiver 302 includes a PLL circuit 304 whose lock time is to be measured using the method of the present invention. The PLL lock time specification for this device in this particular illustrative example is for the PLL circuit 304 to settle within 1 KHz of 1571.328 MHz within 1 millisecond. For this example, the PLL lock time was measured using a Teradyne's A575 RF and mixed signal tester. FIG. 3 shows the block diagram of the device and the test instruments used to perform this test. A UW6000 source 306 (e.g., source 306 is part of a RF tester designed by Teradyne) is used to source a 1575.42 MHz signal to the receiver 302, this signal is down-converted to the intermediate frequency (IF) of 4.092 MHz by an internally generated LO at 1571.328 MHz inside of receiver 302. The IF output is digitized using VHFDIG 310, which is a 12-bit, 100 MSPS, digitizer. The sampling frequency used for this illustrative example is 32.736 MHz. The following steps are then performed to measure the lock time:

Step 1: The input source is set to the required frequency and started.

Step 2: Device 302 is programmed in the power down state to disable the PLL circuit 304.

Step 3: Input range and sampling frequency of the digitizer 310 is set to appropriate values for the test.

Step 4: Device 302 is powered up by writing into the control register using the appropriate test pattern.

Step 5: Just after the register write is complete in step 4, digitizer 310 is triggered from the same pattern.

Step 6: Data is then captured for T=6.2 ms (200 K samples).

Step 7: Amplitude and the mean of the settled waveform is determined from last one thousand samples.

Step 8: The mean is subtracted from the captured waveform and it is normalized to 1.0 by dividing it by the amplitude.

Figure 4:
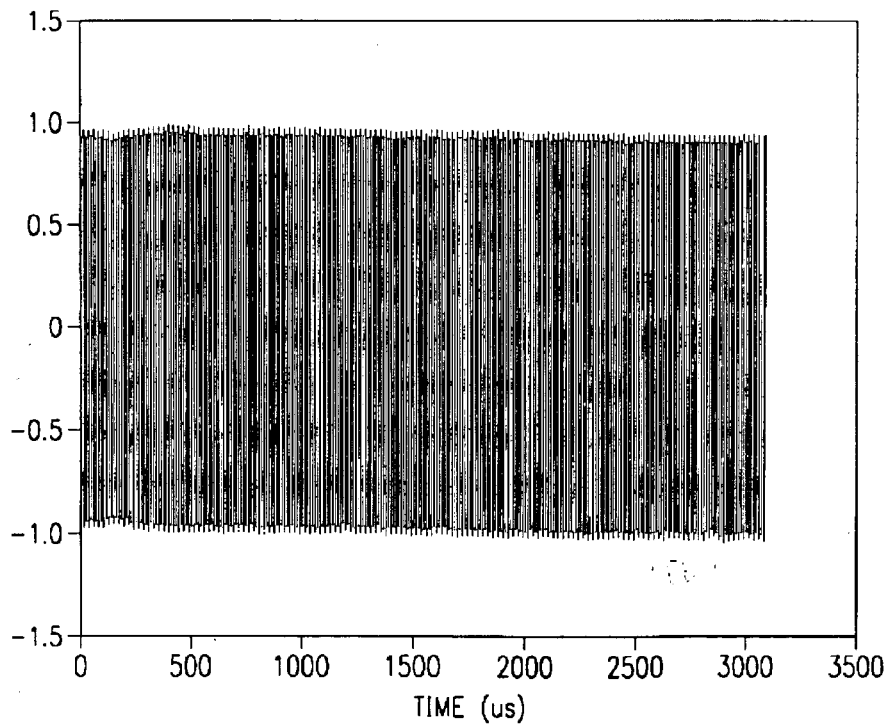
FIG. 4 shows a graph of a waveform y1 for one particular example in accordance with the invention.
Figure 5:
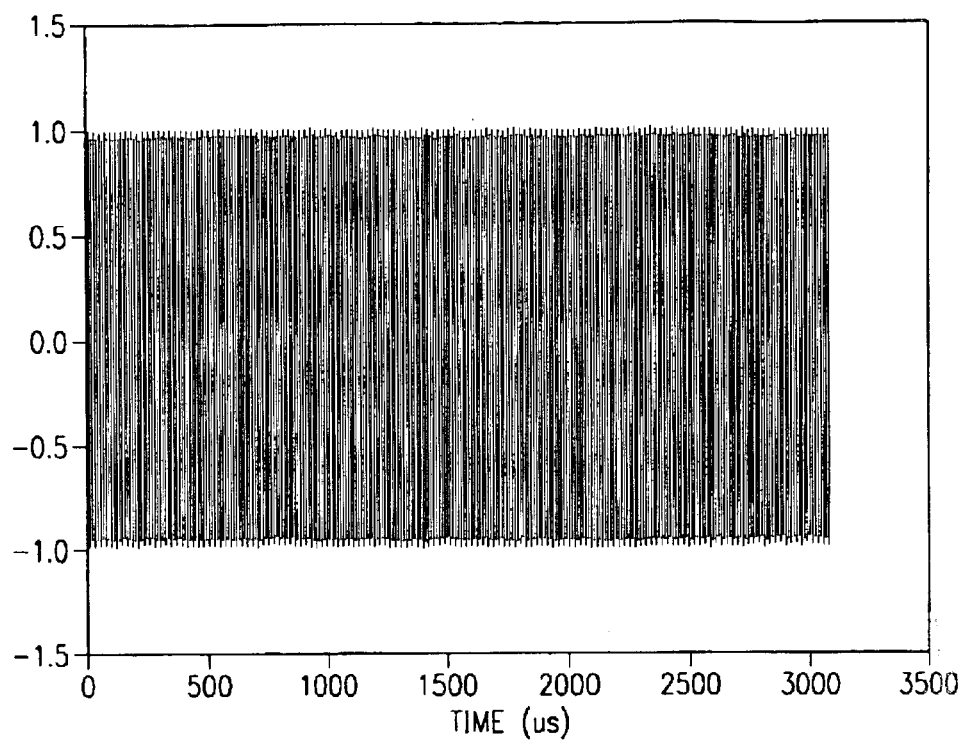
FIG. 5 shows a graph of a waveform y2 in accordance with the invention.

Step 9: The captured data is then divided into two equal waveforms y1 and y2 of 100 K (100,000) samples (3.1 ms). FIG. 4 shows the waveform y1, while FIG. 5 shows the waveform y2.

Figure 6:
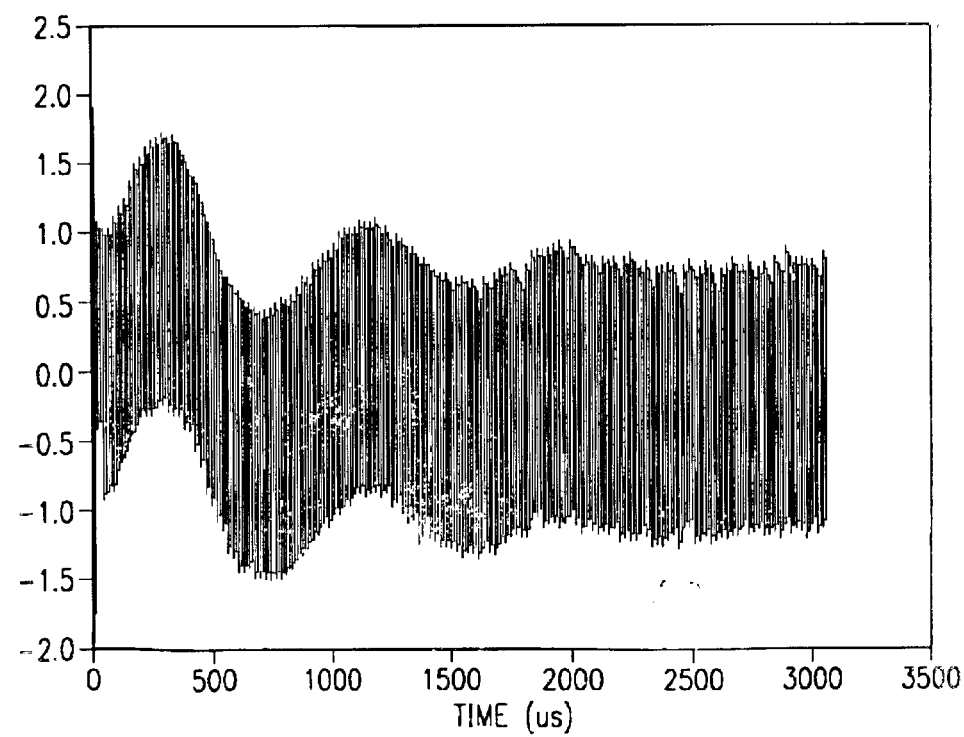
FIG. 6 shows a graph of a waveform y3 in accordance with the invention.

Step 10: The two waveforms y1 and y2 are then multiplied together with a factor of 2 to get y3, which is shown in FIG. 6.

Step 11: Waveform y3 is divided into equal windows of 1 K (1,000) samples ($\Delta T$=31 us).

Figure 7:
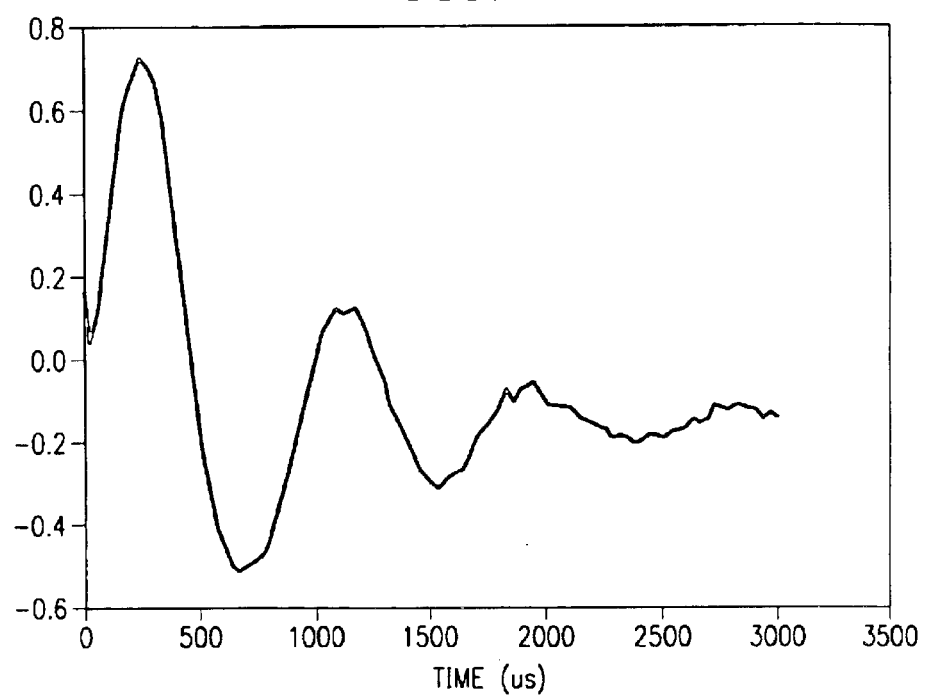
FIG. 7 shows a graph of a waveform y4 in accordance with the invention.

Step 12: For 100 such windows (N=100), the mean is calculated and put in an array to get the envelope, y4. Waveform y4 is shown in FIG. 7.

Figure 8:
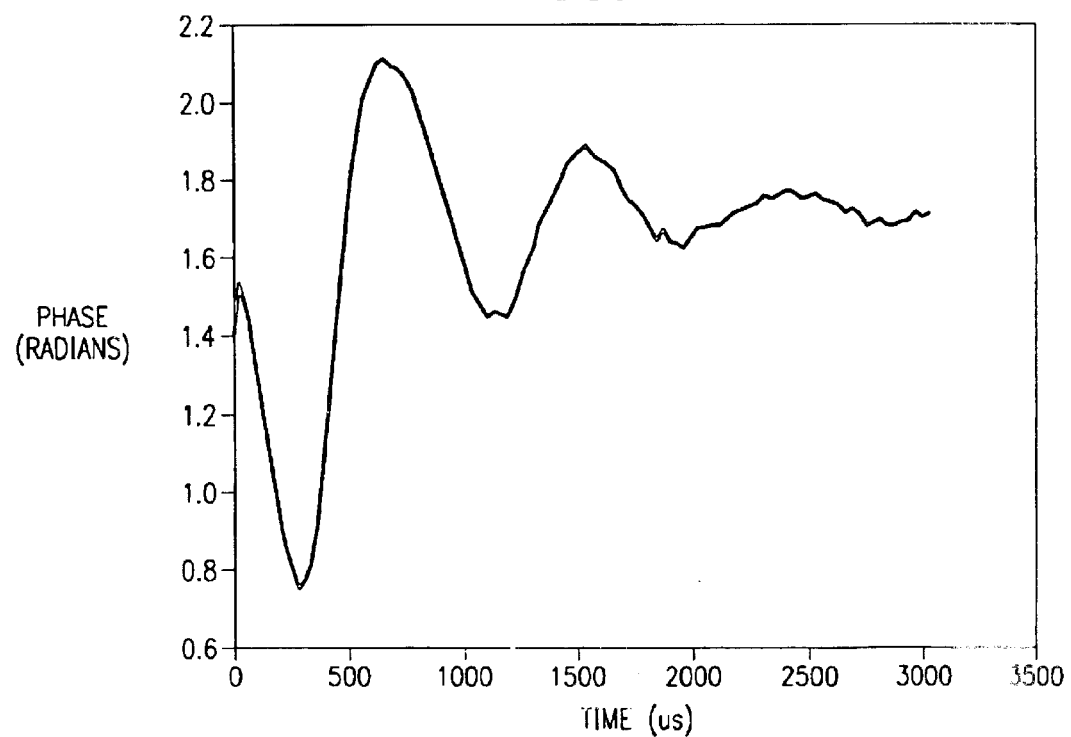
FIG. 8 shows a graph of a waveform y5 in accordance with the invention.

Step 13: For all the 100 elements of the array, an arccosine operation is performed to get waveform y5 that is shown in FIG. 8.

Step 14: Differentiation with respect to time is then performed on waveform y5 to get y6, where y6(n)=(y5(n)−y5(n−1))/$\Delta T$.

Figure 9:
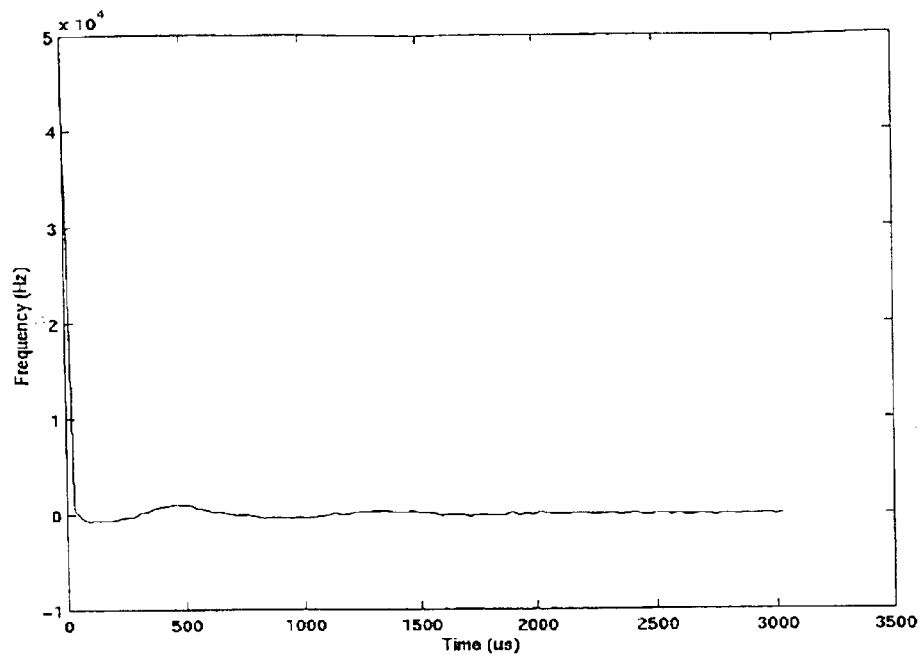
FIG. 9 shows a graph of a waveform y7 in accordance with the invention.

Step 15: Waveform y7 shown in FIG. 9 is derived from y6 by dividing all the elements by a factor of $2\pi$.

Figure 10:
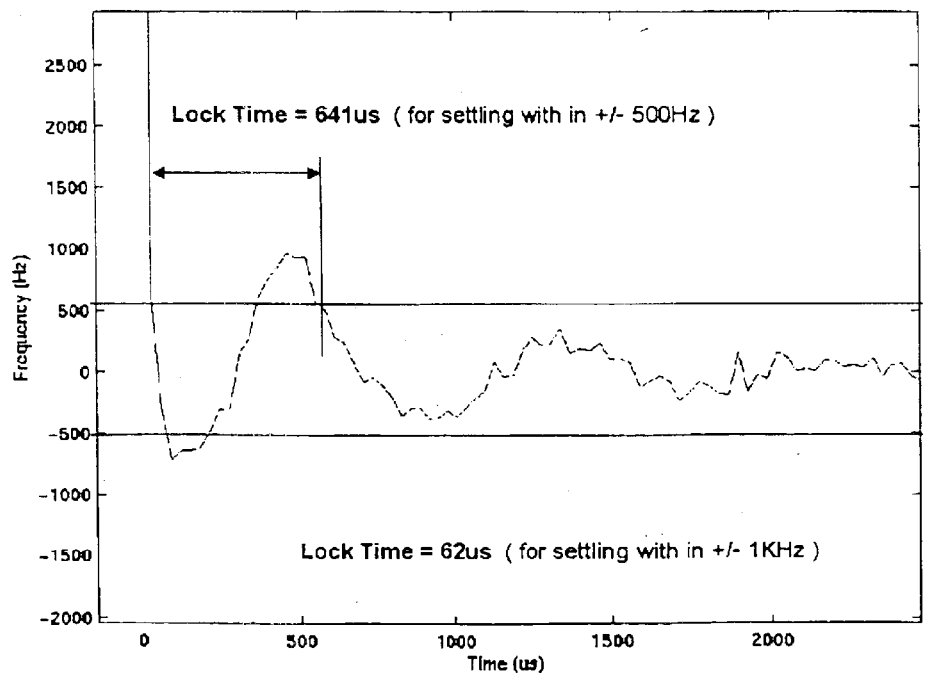
FIG. 10 shows a zoomed in version of FIG. 9 highlighting how the PLL lock time is determined in accordance with the invention.

Step 16: The PLL lock time is then measured form waveform y7. In this particular example, it is determined to be 62 us for 1 KHz, and for 500 Hz settling, it is 641 us. FIG. 10, which is a "zoomed-in" version of FIG. 9 for the relevant time period, graphically highlights these results.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for measuring the lock time of a phase lock loop (PLL) that provides an output signal, comprising the steps of:

(a) capturing the PLL output signal over a predetermined amount of time;

(b) performing amplitude normalization on the captured PLL output signal;

(c) dividing the captured waveform into two waveforms, y1 and y2;

(d) multiplying the two waveforms y1 and y2 together and by a predetermined factor in order to derive a waveform, y3;

(e) deriving the envelope of y3 in order to generate an envelope waveform y4;

(f) performing an arccosine operation to the envelope waveform y4 in order to generate a waveform y5;

(g) differentiating waveform y5 with respect to time in order to generate a waveform y6;

(h) dividing waveform y6 by a predetermined amount in order to generate a waveform y7; and (i) measuring the lock time of the PLL using waveform y7.

2. The method as defined in claim 1, wherein step (b) comprises the substeps of (b1) determining the amplitude and mean from a portion of the captured output signal; and (b2) subtracting the mean determined in step (b1) from the PLL output signal captured in step (a); and (b3) normalizing the result from step (b2) by dividing the result of step (b2) by the amplitude.

3. A method as defined in claim 2, wherein the portion of the output signal that the mean and amplitud determined in step (b1) are derived from a latter portion of the PLL output signal captured in step (a) after the PLL output signal has settled.

4. A method as defined in claim 1, wherein in step (c) the waveforms y1 and y2 are divided into equal time length waveforms.

5. A method as defined in claim 1. wherein the predetermined factor in step (d) is equal to two.

6. A method as defined in claim 1, wherein the predetermined amount in step (h) is $2\pi$.

7. A method as defined in claim 1, wherein waveform y1 can be represented as $y1(t)=\cos(2\pi f_0 t+g(t)+\phi_1)$, for $0=<t<T/2$, and waveform y2 can be represented as $y2(t)=\cos(2\pi f_0 t+\phi_2)$, for $T/2=<t<T$, where T is the amount of time the PLL output signal is captured, $f_0$=locked frequency of the PLL, $g(t)$=phase modulation function (in radians), which becomes zero when the PLL is locked, and $\phi_1$=initial phase of waveform y1, and $\phi_2$=initial phase of waveform y2.

8. A method as defined in claim 7, where y3 contains a high frequency component, $z1=\cos(4\pi f_0 t+g(t)+\phi_1+\phi_2)$ and a low frequency component $z2=[\cos(g(t)+\phi_1-\phi_2)]$, and a time interval $\Delta T$ is considered, such that $T=N\Delta T$, $\Delta T$ is chosen such that $\Delta T$ contains multiple cycles of z1, and the value of z2 is relatively constant in this time interval, and in step (e) waveform y4 is equal to: $y4(n\Delta T)=\cos(g(n\Delta T)+\phi_1-\phi_2)$ for $0=<n<N$.

9. A method as defined in claim 8, wherein in step (f), waveform y5 is equal to $y5(n\Delta T)=\cos^{-1}[y4(n\Delta T)]=g(n\Delta T)+\phi_1-\phi_2$ for $0=<n<N$, and where waveform y5 represents the phase modulation function.

10. A method as defined in claim 9, wherein in step (g), waveform y6 is equal to $y6(n\Delta T)=(y5(n\Delta T)-y5((n-1)\Delta T))/\Delta T$ for $1=<N$; where waveform y6 represents $d/dt(g(t))$, and is the frequency modulation term (in radians/sec) that is of interest.

11. A method as defined in claim 10, wherein waveform y7 is equal to $y7(n\Delta T)=y6(n\Delta T)/2$ for $1=<n<N$, where y7 gives the frequency variation with respect to $f_0$ (in Hz) versus time.

12. A method as defined in claim 1, wherein in step (I) the PLL lock time is calculated from waveform y7 by determining the time after which the frequency variation relative to $f_0$ is within the required limits.

13. A method for measuring the lock time of a phase lock loop (PLL) that provides an output signal, comprising the steps of:

(a) capturing the PLL output signal over a predetermined period of time;

(b) deriving a PLL frequency-settling function from the captured PLL output signal; and (c) determining the PLL lock time from the PLL frequency-settling function;

wherein in step (b) the PLL frequency-settling function is derived by performing demodulation and envelope extraction of the captured PLL output signal in the time domain.

14. A method as defined in claim 13, wherein step (a) is performed using a digitizer.

* * * * *